(12) United States Patent
Du et al.

(10) Patent No.: US 8,008,836 B2
(45) Date of Patent: Aug. 30, 2011

(54) PIEZOELECTRIC PHASE SHIFTER

(75) Inventors: Jinlong Du, Beijing (CN); Bin Wu, Beijing (CN)

(73) Assignee: Newlighting Electronics Co. Ltd., Beijing (CN)

( * ) Notice: Subject to any disclaimer, the term of this patent is extended or adjusted under 35 U.S.C. 154(b) by 346 days.

(21) Appl. No.: 12/342,552

(22) Filed: Dec. 23, 2008

(65) Prior Publication Data

US 2010/0156252 A1 Jun. 24, 2010

(51) Int. Cl.
*H02N 2/18* (2006.01)

(52) U.S. Cl. ............... 310/311; 310/316.01; 310/316.02; 310/317; 310/366

(58) Field of Classification Search .................. 310/311, 310/316.01, 316.02, 317, 366
See application file for complete search history.

(56) References Cited

U.S. PATENT DOCUMENTS

| | | | | |
|---|---|---|---|---|
| 5,969,954 A * | 10/1999 | Zaitsu | ............................ | 363/16 |
| 5,977,688 A * | 11/1999 | Utsunomiya et al. | ..... | 310/316.01 |
| 6,072,263 A * | 6/2000 | Toda | ......................... | 310/313 B |
| 6,566,821 B2 * | 5/2003 | Nakatsuka et al. | ..... | 315/209 PZ |
| 6,583,534 B1 * | 6/2003 | Nakatsuka et al. | .......... | 310/359 |
| 6,812,623 B2 * | 11/2004 | Takeda et al. | ................. | 310/359 |
| 6,987,488 B1 * | 1/2006 | Chang et al. | ................. | 343/767 |
| 2002/0011764 A1 * | 1/2002 | Nakatsuka et al. | .......... | 310/359 |
| 2002/0024269 A1 * | 2/2002 | Nakatsuka et al. | .......... | 310/318 |
| 2006/0284703 A1 * | 12/2006 | Iwasaki et al. | ............... | 333/133 |

* cited by examiner

*Primary Examiner* — Thomas M Dougherty
*Assistant Examiner* — Bryan P Gordon
(74) *Attorney, Agent, or Firm* — Wolf, Greenfield & Sacks, P.C.

(57) ABSTRACT

The disclosed is a piezoelectric phase shifter, which comprises: an input part for inputting input voltages; an output part for outputting output voltages; and a control part for tuning phase difference between the output and input voltages, which are made of a piezoelectric ceramic plate. Further, the input, output and control parts are separated by insulating gaps respectively. The wide phase shift range and good ability to manage high power and relatively high energy transmission efficiency may be obtained by the disclosure.

10 Claims, 1 Drawing Sheet

PIEZOELECTRIC PHASE SHIFTER

TECHNICAL FIELD OF THE INVENTION

The present invention generally relates to the field of the phase shifter in electronics, and more particularly to a piezoelectric phase shifter made of a piezoelectric ceramic plate.

BACKGROUND OF THE INVENTION

At present, Phase shifter has many applications in sensor and actuator system, and some other AC power system. So far, the electronic and photonic phase shifters have been widely used to shift the phase of an AC voltage.

The poor power management ability is the main disadvantage of those phase shifters. Ferroelectric film phase shifters based on the dielectric permittivity$^{\in(E)}$ control were also developed. The disadvantages of this type of phase shifter are that it has a narrow phase shift range, and demands a relatively high DC voltage and complicated fabrication process. Nobody use piezoelectric ceramic as a phase shifter before this invention.

As a result, the existing approaches do not well consider a wide phase shift range, good ability to manage high power and relatively high energy transmission efficiency.

SUMMARY OF THE INVENTION

Accordingly, the present invention provides a piezoelectric phase shifter which consists of three parts made of a piezoelectric ceramic plate, to ensure a wide phase shift range by smoothly tuning the phase difference between the input and output voltages.

The disclosed is a piezoelectric phase shifter, which includes: an input part for inputting input voltages; an output part for outputting output voltages; and a control part for tuning phase difference between the output and input voltages, which are made of a piezoelectric ceramic plate.

As can be seen from the above, in the disclosure, the phase difference between the output and input voltages can be tuned, so that the wide phase shift range and good ability to manage high power and relatively high energy transmission efficiency may be obtained.

BRIEF DESCRIPTION OF THE DRAWINGS

The above and other advantages of the present disclosure will become more apparent by describing the embodiments in detail with reference to the accompanying drawings, furthermore the drawings described herein are for illustration purposes only and are not intended to limit the scope of the present disclosure in any way, in which.

DETAILED DESCRIPTION OF THE PREFERRED EMBODIMENTS

The following description is merely exemplary in nature and is not intended to limit the present disclosure, application, or uses.

The embodiments are further illustrated in detail in conjunction with the drawings to make embodiments of the technical solutions and the advantages more apparent.

Figure 1:
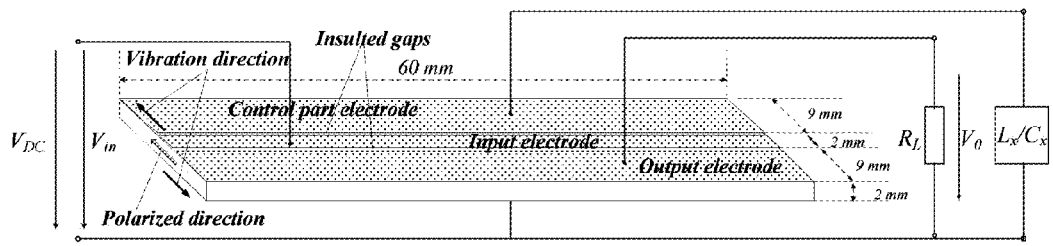
FIG. 1 schematically illustrates construction and dimensions of an embodiment of the piezoelectric phase shifter.

As shown in FIG. 1, it illustrates construction and dimensions of an embodiment of the piezoelectric phase shifter. The piezoelectric phase shifter comprises an input part for inputting input voltages $V_{in}$; an output part for outputting output voltages $V_o$; and a control part for tuning phase difference between the output and input voltages, which are made of a piezoelectric ceramic plate. Namely the piezoelectric phase shifter is made of a piezoelectric ceramic plate poled along the width direction, the polarized direction is shown in the FIG. 1. Here the input voltages $V_{in}$ is Direct Current voltage inputting, and the output voltages $V_o$ is obtained from the resistance $R_L$.

As shown in the FIG. 1, the electrodes on the top and bottom surfaces (merely showing the electrodes on the top surfaces) are separated by the narrow insulating gaps along the length direction to form the input, output and control parts. Namely, the input, output and control parts are separated by insulating gaps respectively. So the input, output and control parts are also called the input, output and control electrodes. The electric field at the input part is perpendicular to the poling direction (not shown in figs). Please referred to the FIG. 1 again, the piezoelectric ceramic plate employs a thickness shear vibration along the poling direction to operate. And the vibration direction is clearly shown in figs. Here, the operating mode that is a thickness shear vibration along the poling direction is merely illustrative manner, and the other operating mode such as a radial shear vibration along the poling direction and a longitude shear vibration along the poling direction may be employed.

Tunable inductor or capacitor is used at the control part to tune the phase difference between the output and input voltages, i.e. the tunable inductor or capacitor is connected to the control part. The inductance Lx and capacitance Cx of them are called as control inductance and control capacitance, respectively.

FIG. 1 shows the dimensions of the embodiment, thickness of the input, output and control parts are 2 mm respectively, length of the input, output and control parts are 60 mm respectively, and width of the output and control parts are 9 mm respectively, and the width of the input part is 2 mm.

Figure 2:
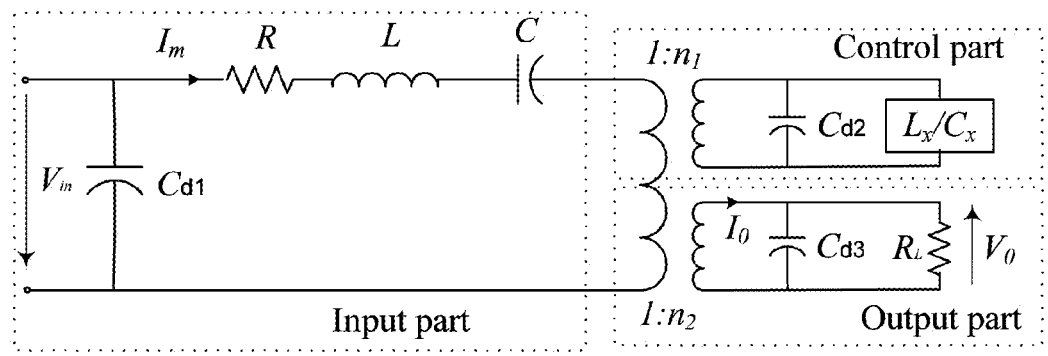
FIG. 2 shows the equivalent circuit of the piezoelectric phase shifter according to the present disclosure.

As shown in FIG. 2, it is the equivalent circuit of the piezoelectric phase shifter according to the present disclosure. In FIG. 3, L, C and R are the equivalent inductance, capacitance and resistance, respectively of the input part; $C_{d1}$, $C_{d2}$ and $C_{d3}$ are the clamped capacitance of the input, control and output parts, respectively; n1 and n2 are the turns ratio of the ideal piezoelectric phase shifter for the control and output parts, respectively. Experimental values of the equivalent circuit parameters are shown in Table 1.

TABLE 1

The experimental values of the equivalent circuit parameters

| Parameters | Values | Parameters | Values |
| --- | --- | --- | --- |
| R (Ω) | 2.8 | $C_{d1}$ (nF) | 0.70 |
| L (mH) | 0.64 | $C_{d2}$ (nF) | 1.7 |
| C (nF) | 0.148 | $C_{d3}$ (nF) | 1.2 |
| $n_1$ | 0.60 | $R_L$ (Ω) | 251 |
| $n_2$ | 0.54 | $f_a$ (kHz) | 571 |
| $f_r$ (kHz) | 546 | | |

Here the values of L, C, R, $C_{d1}$, $C_{d2}$, $C_{d3}$, resonance frequency $f_r$ and antiresonance frequency $f_a$ were measured by the impedance analyzer HP 4194 A, and n1 and n2 was calculated by $$n_1 = \sqrt{\frac{L_2}{L}} \text{ and } n_2 = \sqrt{\frac{L_3}{L}}, \quad (1)$$

Where $L_2$ and $L_3$ are the equivalent inductance of control and output parts, respectively, which were measured by impedance analyzer. From the circuit, the phase difference between motional current $I_m$ and the input voltage $V_{in}$ is $$\angle I_m - \angle V_{in} = \arctan\left(\frac{\frac{1}{\omega C'} - \omega L'}{R'}\right), \quad (2a)$$

$$L' = L + \Delta L \quad (2b)$$

$$C' = C + \Delta C \quad (2c)$$

$$R' = R + \Delta R \quad (2d)$$

where $\omega = 2\pi f_r$, $\Delta L$, $\Delta C$, and $\Delta R$ are the inductance, capacitance and resistance of the control and output parts referred to the motional branch. From the circuit, it is known that the phase difference between the motional current $I_m$ and output current $I_o$ is zero; the phase difference between the output current $I_o$ and output voltage $V_o$ is approximately a constant $\phi_o$ under the matching load condition. So the phase difference $\Delta\phi$ between the output voltage $V_o$ and input voltage $V_{in}$ is $$\Delta\phi = \angle V_o - \angle V_{in} = \arctan\left(\frac{\frac{1}{\omega C'} - \omega L'}{R'}\right) + \phi_o \quad (3)$$

Therefore, the phase difference $\Delta\phi$ between the output voltage $V_o$ and input voltage $V_{in}$ is mainly affected by the phase difference between the motional current $I_m$ and $V_{in}$. $\Delta L$ and $\Delta C$ can be controlled by $L_x$ and $C_x$, respectively. Hence, the phase difference between the output voltage $V_o$ and input voltage $V_{in}$ can be controlled by the inductance or capacitance $L_x$ or $C_x$. namely the phase difference may be increased by decreasing the inductance or capacitance at the control part. Therefore, by implementing the piezoelectric phase shifter, it is advantageous to have wide phase shift range, good ability to manage high power and relatively high energy transmission efficiency.

This embodiment presents a new technique of shifting the phase of a low-frequency AC voltage. The piezoelectric phase shifter is made of a piezoelectric ceramic plate operating at the thickness shear vibration mode. The piezoelectric ceramic plate consists of input, output and control parts. The control part is connected to a tunable inductor or capacitor, which can tune the phase shift between the output and input voltages smoothly. So Compared with the commonly used phase shifters, the piezoelectric phase shifter not only has a very simple structure, light weight and low profile, but has a wide phase shift range, good ability to manage high power and relatively high energy transmission efficiency.

The invention is derived from the multi-output piezoelectric transformer. And the equivalent circuit of the piezoelectric phase shifter is the same as that of a multi-output piezoelectric transformer, namely the piezoelectric transformer has the same structure as the disclosed piezoelectric phase shifter.

The invention has been described in an illustrative manner, and it is to be understood that the terminology that has been used is intended to be in the nature of words of description rather than of limitation. Obviously, many modifications and variations of the present invention are possible in light of the above teachings. It is, therefore, to be understood that within the scope of the appended claims the invention may be practiced otherwise than as specifically described.

What is claimed is:

1. A piezoelectric phase shifter, comprising:
   an input part for inputting input voltages;
   an output part for outputting output voltages; and
   a control part for tuning phase difference between the output and input voltages, which are made of a piezoelectric ceramic plate.

2. The piezoelectric phase shifter according to claim 1, wherein the input, output and control parts are separated by insulating gaps respectively.

3. The piezoelectric phase shifter according to claim 2, wherein an electric field at the input part is perpendicular to a poling direction of the piezoelectric ceramic plate.

4. The piezoelectric phase shifter according to claim 3, wherein a tunable inductor or capacitor is connected to the control part, for tuning the phase difference between the output and input voltages.

5. The piezoelectric phase shifter according to claim 4, wherein the phase difference $\Delta\phi$ between the output and input voltages is computed as follows:

$$\Delta\phi = \angle V_o - \angle V_{in} = \arctan\left(\frac{\frac{1}{\omega C'} - \omega L'}{R'}\right) + \phi_o$$

where $V_o$ denotes the output voltage $V_o$, $V_{in}$ denotes the input voltage, L'=L+$\Delta$L, C'=C+$\Delta$C, R'=R+$\Delta$R, L, C and R are the equivalent inductance, capacitance and resistance of the input part, respectively;

$\Delta L$, $\Delta$, and $\Delta R$ are the equivalent inductance, capacitance and resistance of the control and output parts, $\omega = 2\pi f_r$ and $f_r$ denotes resonance frequency, and $\phi_o$ denotes constant.

6. The piezoelectric phase shifter according to claim 5, wherein the piezoelectric ceramic plate is poled along a width direction of the piezoelectric phase shifter.

7. The piezoelectric phase shifter according to claim 6, wherein the piezoelectric ceramic plate operates at a thickness shear vibration along the poling direction.

8. The piezoelectric phase shifter according to claim 6, wherein the piezoelectric ceramic plate operates at a radial shear vibration along the poling direction.

9. The piezoelectric phase shifter according to claim 6, wherein the piezoelectric ceramic plate operates at a longitude shear vibration along the poling direction.

10. The piezoelectric phase shifter according to claim 1, wherein thickness of the input, output and control parts are 2 mm respectively, length of the input, output and control parts are 60 mm respectively, and width of the output and control parts are 9 mm respectively, and the width of the input part is 2 mm.

* * * * *